United States Patent [19]

Yamane

[11] Patent Number: 5,281,545

[45] Date of Patent: Jan. 25, 1994

[54] PROCESSES FOR MANUFACTURING A SEMICONDUCTOR DEVICE

[75] Inventor: Satoshi Yamane, Kobe, Japan

[73] Assignee: Ricoh Company, Ltd., Tokyo, Japan

[21] Appl. No.: 827,899

[22] Filed: Jan. 30, 1992

Related U.S. Application Data

[63] Continuation of Ser. No. 644,447, Jan. 23, 1991, abandoned, which is a continuation of Ser. No. 868,191, May 27, 1986, abandoned, which is a continuation of Ser. No. 554,605, Nov. 23, 1983, abandoned.

[30] Foreign Application Priority Data

Dec. 10, 1982 [JP] Japan .................................. 57-217654

[51] Int. Cl.$^5$ ............................................. H01L 21/265
[52] U.S. Cl. .......................................... 437/31; 437/59
[58] Field of Search ................................... 437/59, 31

[56] References Cited

U.S. PATENT DOCUMENTS

| | | | |
|---|---|---|---|
| 4,016,596 | 4/1977 | Magdo et al. | 357/43 |
| 4,299,024 | 11/1981 | Piotrowski | 357/43 |
| 4,346,512 | 8/1982 | Liang et al. | 437/59 |
| 4,412,237 | 10/1983 | Matsumura et al. | 357/45 |
| 4,484,388 | 11/1984 | Iwasaki | 357/43 |
| 4,893,168 | 1/1990 | Takahashi et al. | 357/68 |

FOREIGN PATENT DOCUMENTS

| | | | |
|---|---|---|---|
| 23118 | 1/1981 | European Pat. Off. | 307/475 |
| 57-181152 | 11/1982 | Japan | 357/45 M |
| 57-211248 | 12/1982 | Japan | 357/45 M |
| 58-56354 | 4/1983 | Japan | 357/45 M |
| 58-162048 | 9/1983 | Japan | 357/45 M |

OTHER PUBLICATIONS

Zimmer et al., "A Fully Implanted NMOS, CMOS, Bipolar Technology for VSLI of Analog-Digital Systems," *IEEE Trans. on Elec. Dev.*, vol. ED-26, No. 4, Apr. 1979, pp. 390-396.

Polinsky et al., "CMOS-Bipolar Monolithic Integrated-Circuit Tech." *IEEE IEDM Technical Digest*, Dec. 3-5, 1973, pp. 229-231.

Link et al. "Cmplementary MOS and Bipolar . . . on a single chip," *Electronics*, Aug. 31, 1970, pp. 72-76.

*Primary Examiner*—Olik Chaudhuri
*Assistant Examiner*—Long Pham
*Attorney, Agent, or Firm*—Cooper & Dunham

[57] ABSTRACT

A Bi-CMOS ( Bipolar-Complementary Metal Oxide Silicon ) gate array includes bipolar transistors, and P-channel and N-channel MOS transistors all formed on the same single chip in the form of an array. Such a chip may provide desired bipolar and MOS transistor characteristics at the same time by itself.

16 Claims, 8 Drawing Sheets

PROCESSES FOR MANUFACTURING A SEMICONDUCTOR DEVICE

This is a continuation of application Ser. No. 07/644,447 filed on Jan. 23, 1991, which in turn is a continuation of application Ser. No. 06/868,191 filed on May 27, 1986, which in turn is a continuation of application Ser. No. 06/554,605 filed on Nov. 23, 1983, all now abandoned.

BACKGROUND OF THE INVENTION

1. Field of the Invention

This invention relates to a gate array, and, particularly, to a Bi-CMOS gate array comprising bipolar transistors and CMOS (Complementary Metal Oxide Silicon transistors arranged in the form of an array.

2. Description of the Prior Art

Semiconductor integrated circuits (ICs) are indispensable for miniaturization and a reduction in power consumption of various electronic devices and appliances. Custom ICs tend to be expensive because its volume of manufacture is relatively small and it takes a relatively long period of time for development, and, thus, it has often been the case to use discrete components and standard ICs in combination to construct desired circuits. In order to satisfy the demand for inexpensive custom ICs, a gate array has been developed. In the case of a gate array, the manufacturer has already prepared the so-called master chips, on which unit cells comprised of standardized resistor and transistor elements are arranged regularly and the diffusion process of which has already been completed. The manufacturer then produces an interconnection mask in accordance with the circuit design which meets the user's specification, and, then, using such a mask, an interconnection pattern of Al or the like is formed on the master chip, thereby completing the wafer processing. In this manner, in the case of a gate array, using different interconnection patterns, various ICs having different circuit configurations may be obtained from the master chips of identical structure. Since it is only necessary to design an interconnection pattern, only a short period of time is required to provide an IC chip having a desired function.

Heretofore, gate arrays have been formed either from bipolar transistors or from MOS transistors exclusively. However, in some applications, it is often required to use not only the characteristics of bipolar transistors but also the characteristics of MOS transistors, and, in such circumstances, it is obliged to use a plurality of IC chips in order to attain a desired function, which is apparently disadvantageous.

SUMMARY OF THE INVENTION

It is a primary object of the present invention to obviate the above-described disadvantages of the prior art and to provide an improved semiconductor device.

Another object of the present invention is to provide an IC chip on which not only bipolar transistors but also CMOS transistors are formed.

A further object of the present invention is to provide a semiconductor device which may be easily and inexpensively fabricated according to the needs of users.

A still further object of the present invention is to provide a Bi-CMOS gate array which comprises bipolar and CMOS transistors arranged in the form of an array, which only requires to form an interconnection pattern so as to become a functional device.

Other objects, advantages and novel features of the present invention will become apparent from the following detailed description of the invention when considered in conjunction with the accompanying drawings.

DESCRIPTION OF THE PREFERRED EMBODIMENTS

Figure 1:
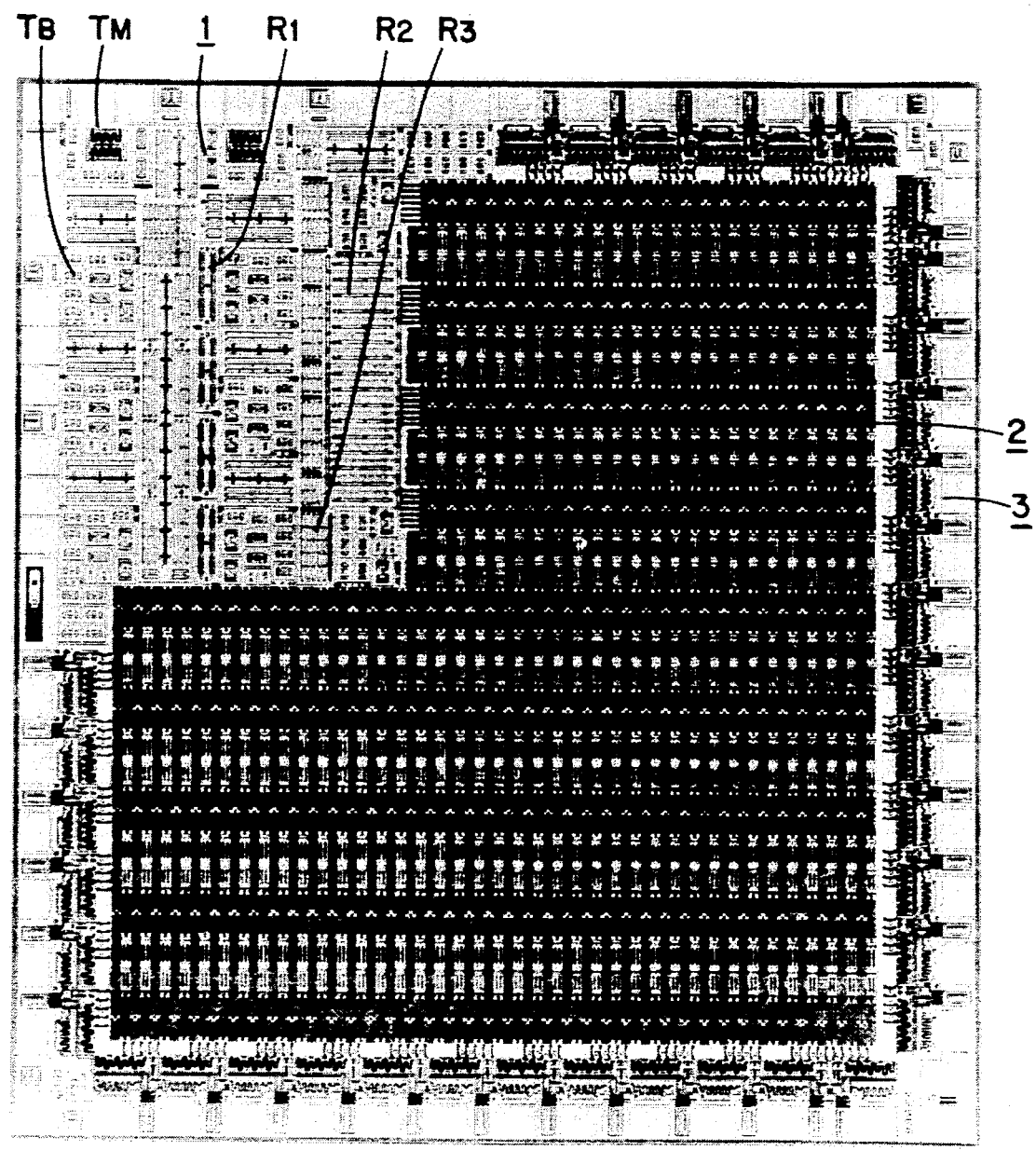
FIG. 1 is a microscopic photograph showing the overall structure of a chip constructed in accordance with one embodiment of the present invention.
Figure 2A:
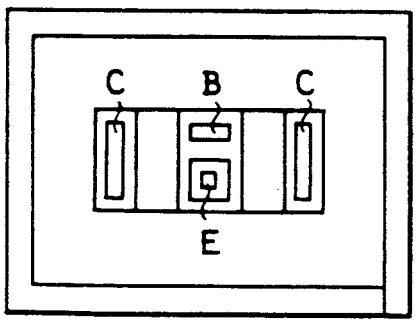
FIGS. 2a and 2b are plan and cross-sectional views, respectively, of NPN transistor employed in the chip of FIG. 1.
Figure 3A:
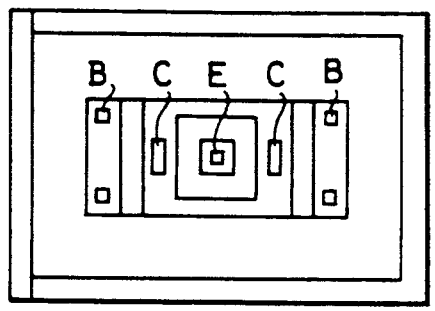
FIGS. 3a and 3b are plan and cross-sectional views, respectively, of PNP transistor employed in the chip of FIG. 1.
Figure 2B:
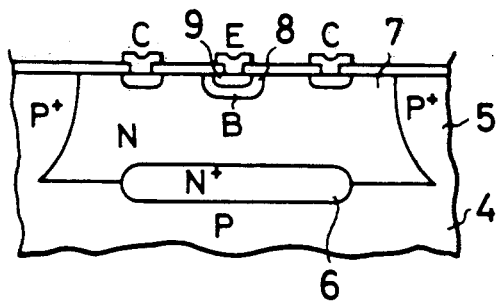
Figure 3B:
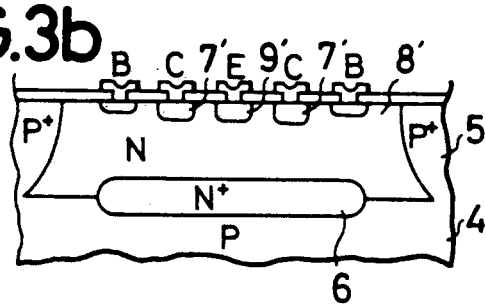

Referring now to FIG. 1, there is shown a Bi-CMOS gate array constructed in accordance with one embodiment of the present invention, and it generally contains a bipolar analog circuit section 1, a CMOS logic circuit section 2 and an input/output buffer circuit section 3 provided in the peripheral region. Bipolar analog circuit section 1 includes NPN and PNP bipolar transistors $T_B$, several kinds of diffused resistors $R_1$, $R_2$ and $R_3$ and P-channel MOS transistors $T_M$. The NPN transistors include eighty-four (84) small signal transistors and eight (8) driver transistors. One example of NPN transistor is shown in FIGS. 2a and 2b and, as shown, an N type collector region 7 is defined in a P type substrate 4 as isolated by a P+ isolation region 5 and an N+ buried layer. In the collector region 7 is formed a P type base region, in which an emitter region 9 is formed. In this NPN transistor, a pair of collector contacts C is provided so as to increase adaptability to various circuit patterns. Moreover, the PNP transistors include thirty-two (32) lateral transistors and eighteen (18) vertical transistors. FIGS. 3a and 3b show one example of such a lateral PNP transistor, and, as shown, inside of an N type base region 8' formed on the P type substrate is formed a pair of P type collector regions 7', 7' on both sides of a P type emitter region 9'. Also in this PNP transistor, a pair of each of base and collector contacts B and C, respectively, is provided for the convenience of forming various circuit patterns.

Figure 4A:
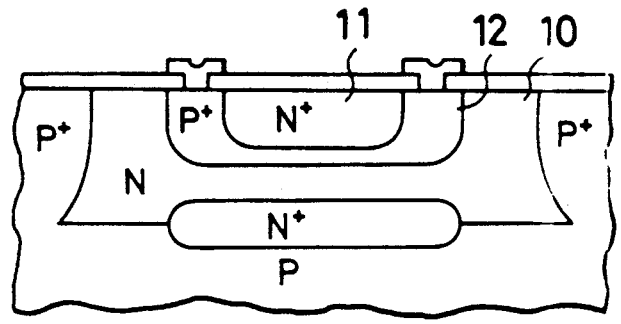
FIGS. 4a through 4c are cross-sectional views showing several examples of resistors employed in the chip of FIG. 1.
Figure 4B:
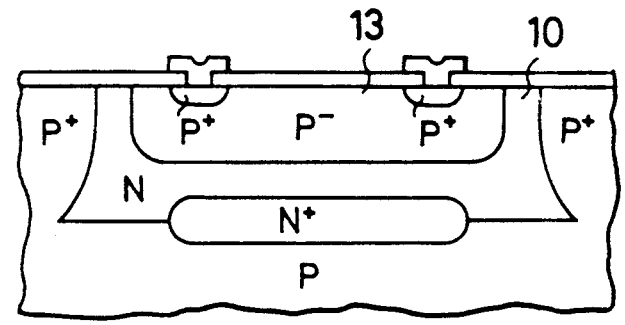
Figure 4C:
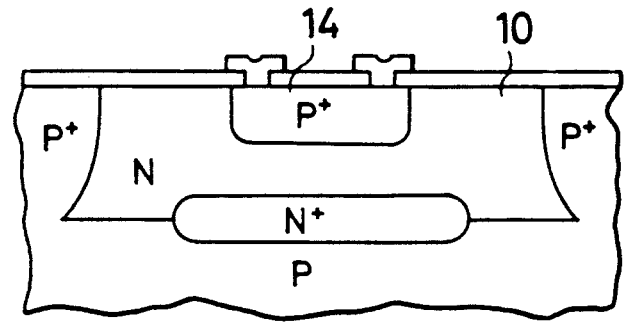

The diffused resistors include twenty-four (24) base pinch resistors $R_1$ of 100 K ohms, eighty-four (84) well resistors $R_2$ of 10 K ohms and three hundred and thirty five (335) base resistors $R_3$ of 1–5 K ohms. As shown in FIG. 4a, the base pinch resistor $R_1$ includes a P+ base pinch region 12 pinched between an N type epitaxial region 10 and an N+ diffused region 11 as a resistor layer. On the other hand, as shown in FIG. 4b, the well resistor $R_2$ includes a P- well 13 formed by ion implantation as a resistor layer, and the base resistor $R_3$, as shown in FIG. 4c, includes a P+ base region 14 as a resistor region.

The bipolar transistors $T_B$, resistors $R_1$–$R_3$ and MOS transistors $T_M$ formed in the bipolar analog circuit section 1 as described above are arranged unit by unit to form operational amplifiers or comparators, and if operational amplifiers are formed, eight of them may be formed by providing a suitable interconnection pattern. In principle, phase compensation is carried out by providing external components such as capacitors.

Figure 5:
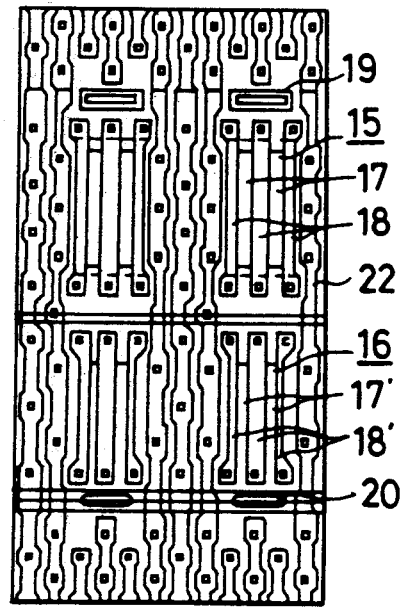
FIG. 5 is a plan view showing part of CMOS logic circuit section of the chip of FIG. 1.

Returning to FIG. 1, the CMOS logic circuit section 2 is provided with two hundred and fifty (250) gates, and, as shown in FIG. 5, its basic cell is comprised of a P-channel MOS region 15 and an N-channel MOS region 16. In FIG. 5, gate regions are indicated by 17 and 17' and source/drain regions are indicated by 18 and 18'. Thus, each MOS region 15 or 16 may contain a pair of MOS transistors. A power supply $V_{CC}$ contact is indicated by 19, a GND contact by 20 and an underpath of polycrystalline silicon by 22. The basic cell includes gates corresponding to a two-input NAND circuit or two-input NOR circuit.

Figure 6:
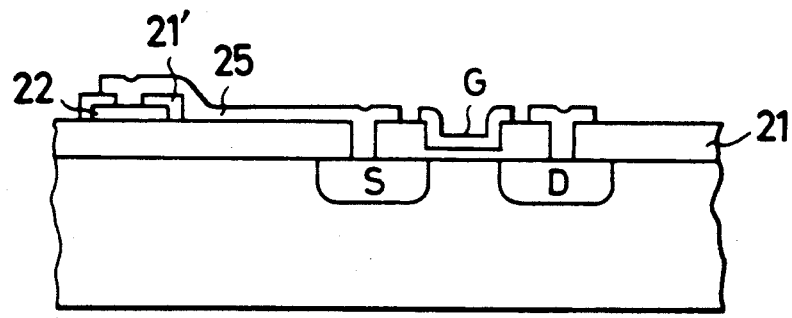
FIG. 6 is a cross-sectional view showing how an interconnection is formed in the CMOS logic circuit section of the chip of FIG. 1.

In the present embodiment, interconnection is provided by a two-layer interconnection technique using metal and polycrystalline silicon. For example, as shown in FIG. 6, an interconnection line 22 of polycrystalline silicon is provided as an underpath as previously formed on a field oxide 21. When forming an interconnection pattern which is finally determined by the user, contact holes are provided in the field oxide 21 and an insulating layer 21', which is a thermal oxide of polysilicon 22, on the underpath 22 at a desired location, thereby allowing the underpath 22 to be connected, for example, to the source S by means of a metal layer 25 formed, for example, by sputtering.

Figure 7:
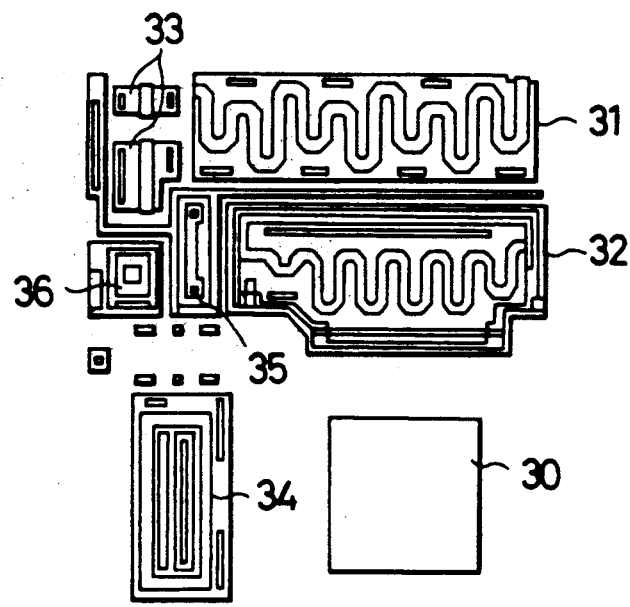
FIG. 7 is a plan view showing part of input and output buffer circuit section of the chip of FIG. 1.

Referring now to FIG. 7, the input/output buffer circuit section 3 provided in the peripheral region of the chip includes a driving P-channel MOS transistor 31, an N-channel MOS transistor 32, an NPN transistor 34, a MOS transistor 33 for matching with TTL, resistors 35 and diodes 36 as disposed in the vicinity of a pad 30.

Now, a Bi-CMOS process for fabricating the above-described gate array will be described. After forming an N+ buried layer in a P type substrate by diffusion, an N type layer is formed on the substrate by epitaxial growth. Then, a P type impurity layer is formed as an isolation layer. Then, after forming an implant layer, the implants are driven in by diffusion to form a P well. Then, a base layer and source and drain regions of a P-channel MOS transistor are formed by ion implantation, which is followed by the step of formation of an emitter layer and source and drain regions of an N-channel MOS transistor by diffusion of an N type impurity. Then, after the steps of gate oxidation and contact formation, a metal interconnection pattern and a passivation layer are formed to complete the process for fabricating the present gate array.

Figure 8:
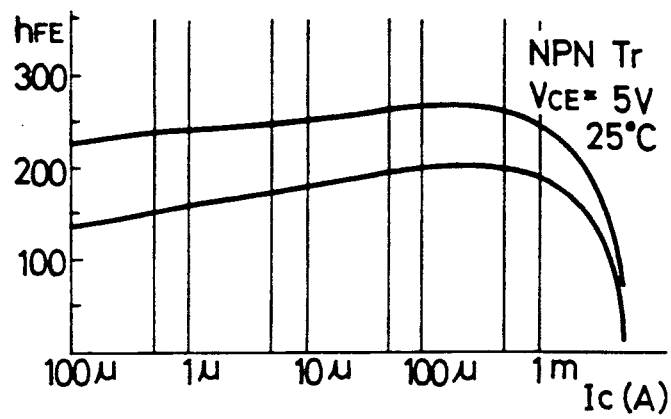
FIGS. 8 and 9 are graphs showing the $h_{FE}$-$I_C$ characteristics of NPN and PNP transistors, respectively, which are employed in the chip of FIG. 1.
Figure 9:
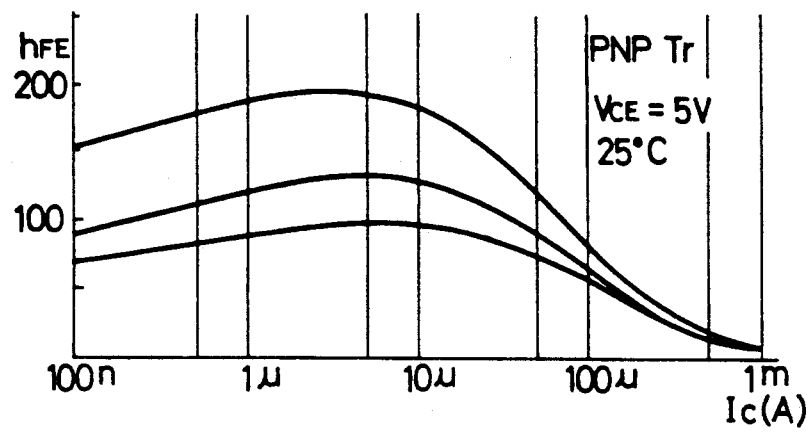
Figure 10:
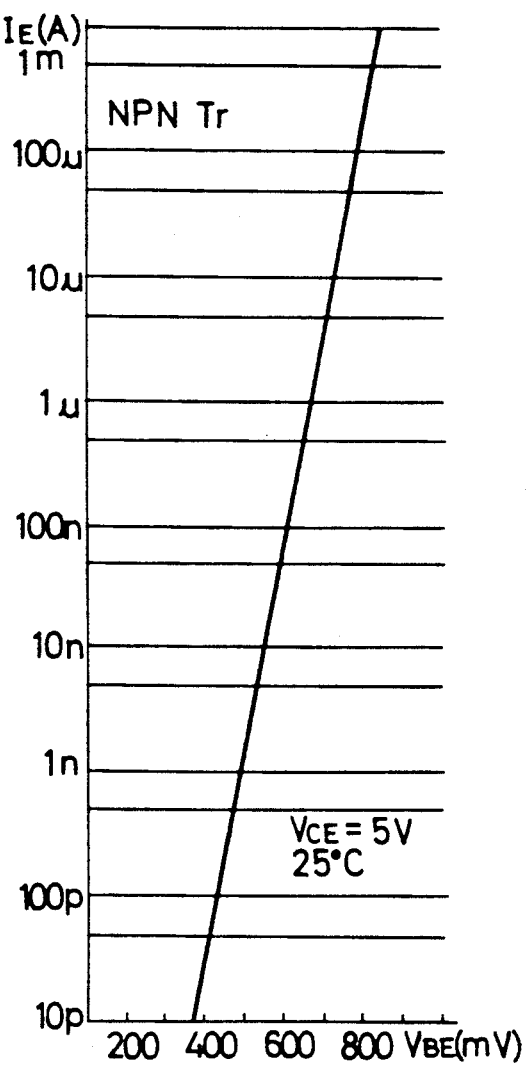
FIG. 10 is a graph showing the $V_{BE}$-$I_E$ characteristics of NPN transistor employed in the chip of FIG. 1.

In accordance with the present invention, wafers of excellent and uniform quality may be fabricated because the ion implantation technique is used significantly and thus the process may be carried out in an automated manner with ease and under precise control The $h_{FE}$-$I_C$ characteristics for some of NPN transistors and PNP lateral transistors for small signal applications formed in the bipolar analog circuit section 1 in the above-described manner are shown in FIGS. 8 and 9. In either case, high $h_{FE}$ characteristics are shown in the small current region, and $h_{FE}$ of PNP transistor in the graph of FIG. 9, in particular, is higher by the factor of 2–3 as compared with a PNP transistor formed in the prior art bipolar process. Furthermore, as shown in the graph of FIG. 10, the $V_{BE}$-$I_E$ characteristics of NPN transistor indicate an excellent agreement with the theory even to the pA order. In addition, the resistance of base resistor $R_3$ may be controlled at high accuracy, for example, of ±15% at max. in absolute accuracy or 2% at max. in relative accuracy.

The input/output buffer circuit section 3 is so formed that it may be directly connected to a TTL, and, furthermore, by appropriately combining P-channel MOS transistor 31, N-channel MOS transistor 32 and NPN transistor 34, various input/output circuits such as CMOS input/output, tri-state and NPN/PNP input/output buffer circuits may be formed. In providing interconnection in the present gate array, a mask to be used for forming contacts and a mask to be used for metallization constitute the two custom masks which are made according to the needs of the user.

Figure 11:
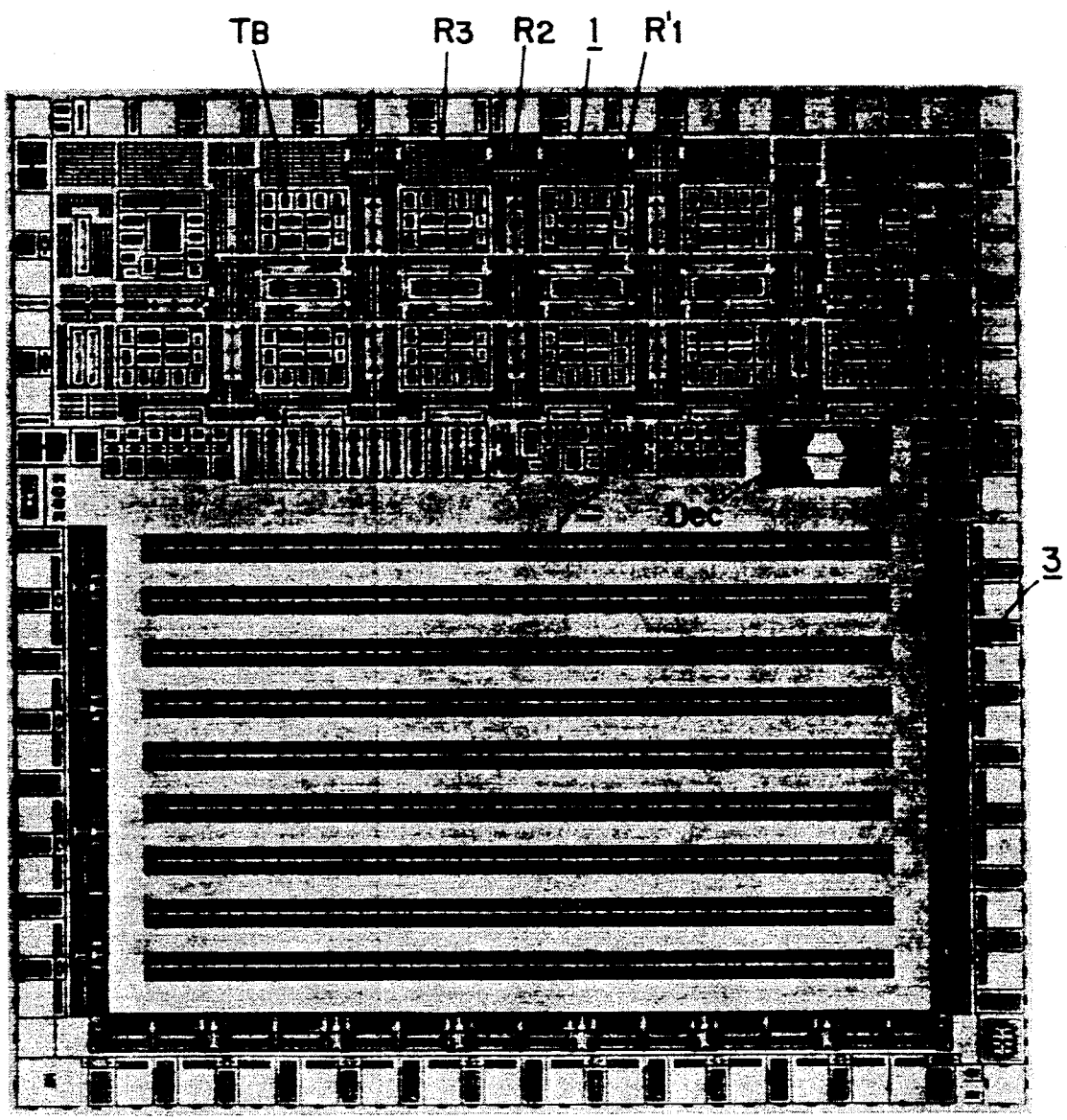
FIG. 11 is a microscopic photograph showing the overall structure of a chip constructed in accordance with another embodiment of the present invention.

FIG. 11 shows another chip fabricated in accordance with another embodiment of the present invention, which includes the bipolar analog circuit section 1, CMOS logic circuit section 2 and input/output buffer circuit section 3 similarly with the previous embodiment of FIG. 1. However, this embodiment is fabricated in accordance with the two-layer metal process and thus there are some differences in structure from the previous embodiment.

Figure 12:
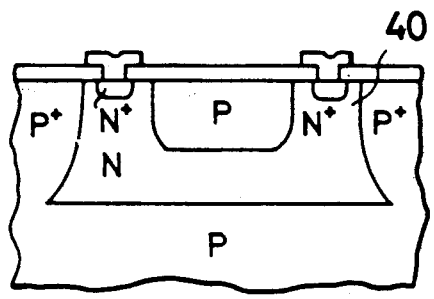
FIG. 12 is a cross-sectional view showing an example of resistor employed in the chip of FIG. 11.

The bipolar analog circuit section 1 includes, as bipolar transistors, ninety-three (93) NPN transistors for small signal applications, eleven (11) driver NPN transistors, forty-nine (49) lateral PNP transistors and twenty-seven (27) vertical PNP transistors. As resistors, twenty-four (24) pinch resistors $R_1'$ of high resistance (100 K ohms ), sixty-six (66) well resistors $R_2$ of 20 K ohms and eight hundreds and seventy-nine (879) base resistors $R_3$ of 1 –5 K ohms are provided. However, the pinch resistors $R_1'$ provided in the input/output buffer circuit section 3 are structurally different from that shown in FIG. 4a, and, as shown in FIG. 12, it is formed by a pinched collector 40. The device characteristics of those transistors formed in the bipolar analog circuit section 1 are the same as those of the previous embodiment and the same accuracy may be attained for the resistors. In addition, an analog switch pattern of MOS transistors is also provided in the master pattern, thereby allowing to extend the scope of applications.

Figure 13:
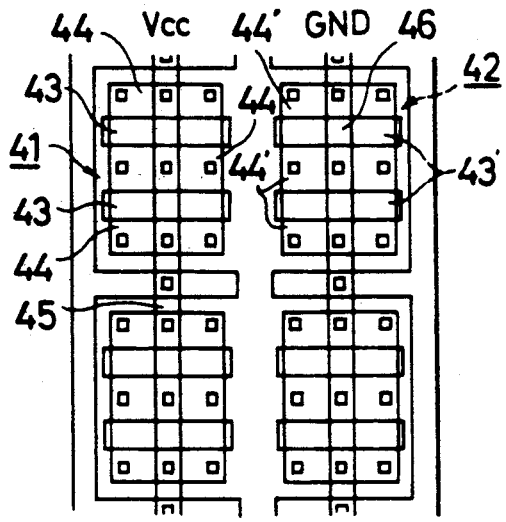
FIG. 13 is a plan view showing part of CMOS logic circuit section in the chip of FIG. 11.

The CMOS logic circuit section 2 in the chip of FIG. 11 includes four hundred (400) gates and two (2) decoders Dec and, as shown in FIG. 13, the basic cell of this gate array is comprised of a P-channel MOS region 41 and an N-channel MOS region 42 similarly with the previous embodiment. Although the pattern differs from the basic cell of FIG. 5, the basic cell of the present embodiment includes two pairs of MOS transistors comprised of gate regions 43, 43' and source/drain regions 44, 44', thereby forming gates which correspond to a two-input NAND circuit or two-input NOR circuit similarly with the case of FIG. 5. Also provided in the chip of FIG. 11 are a power supply $V_{CC}$ metal layer 45 and a GND metal layer 46. The pair of decoders Dec contained in the CMOS logic circuit section 2 of the present embodiment constitutes a three-input decoder, which may be advantageously used for simplification of circuit and effectiveness of pattern.

Figure 14:
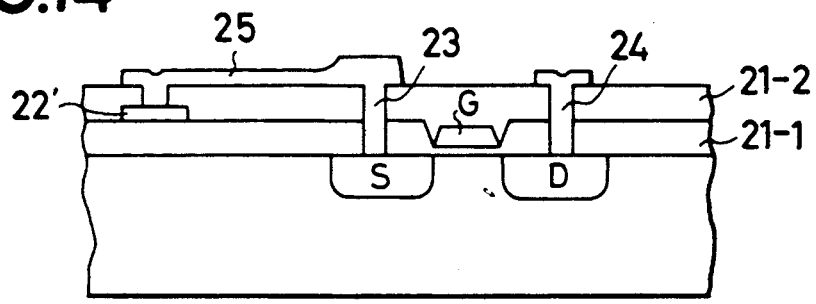
FIG. 14 is a cross-sectional view showing the interconnection structure in the CMOS logic circuit section of the chip of FIG. 11.

The interconnection in the present embodiment slightly differs from that of the previous embodiment, and, as shown in FIG. 14, in the present embodiment, metal interconnection is used for both first and second interconnection layers and vias or contacts 23 and 24 are provided as extending through the first and second $SiO_2$ layers 21-1 and 21-2, so that the distance between the gate G and these contacts 23 and 24 may be made smaller, thereby allowing not only to increase density but also to reduce the number of required masks to shorten the time period required for manufacture of the device.

Figure 16:
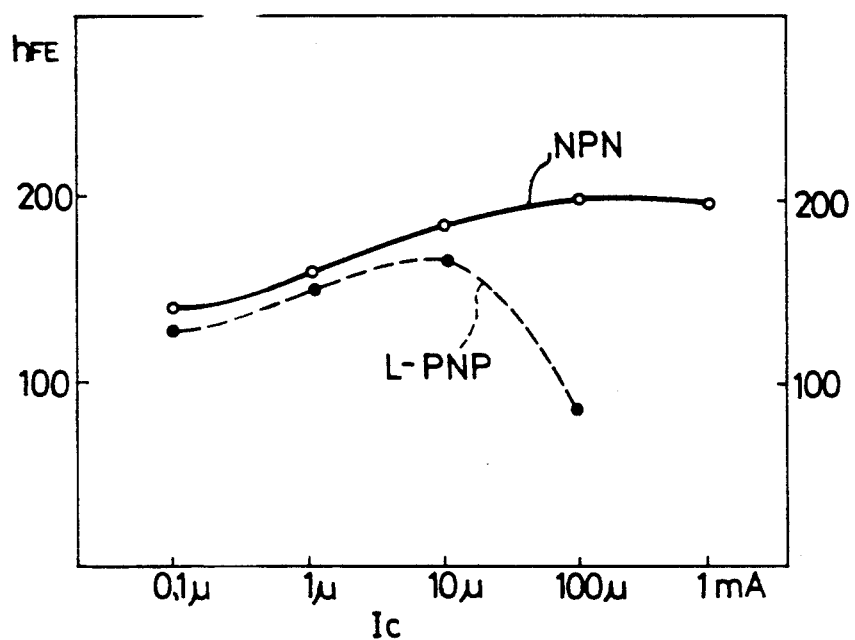
FIG. 16 is a graph showing how the current amplification factor of a transistor formed in accordance with the present invention depends upon its collector current.

The following table 1 compares the logic characteristics of Bi-CMOS gate arrays between those manufactured with the prior art polysilicon and Al interconnection structure and those manufactured with the two-layer interconnection structure of the present invention shown in FIG. 14. As is obvious from the table, the present device is improved in density as well as in operational speed. Table 2 shows the electrical characteristics of the bipolar and MOS transistors of the present invention, and FIG. 16 graphically shows the dependence of current amplification factor on the collector current of NPN and lateral PNP transistors of the present device.

TABLE 1

| Comparison of logic characteristics | | |
|---|---|---|
| | present invention | Prior art interconnection |
| gate delay time (ns) | 4.00 | 5.40 |
| DF/F toggle frequency (MHz) | 11.1 | 6.5 |

TABLE 1-continued

| Comparison of logic characteristics | | |
|---|---|---|
| | present invention | Prior art interconnection |
| density | 1.7 | 1 |

TABLE 2

| | Characteristics of individual transistors | | | | | |
|---|---|---|---|---|---|---|
| | NPNTr | L-PNPTr | V-PNPTr | base R | NMOS | PMOS |
| $I_C =$ 1 mA | 200 | | | | | |
| $h_{FE}$ 100 µA | 200 | 80 | 100 | | | |
| 1 µA | 170 | 160 | 120 | | | |
| $BV_{CEO}$ (V) | 60 | 50 | 70 | | | |
| $BV_{CBO}$ (V) | 110 | 110 | 120 | | | |
| $\bar{x}$ | | | | 200 | | |
| $\sigma$ | | | | ±5% | | |
| $V_{th}$ (V) | | | | | 0.6 | −0.6 |
| source/drain b.d. voltage (V) | | | | | 25 | 20 |

Figure 15:
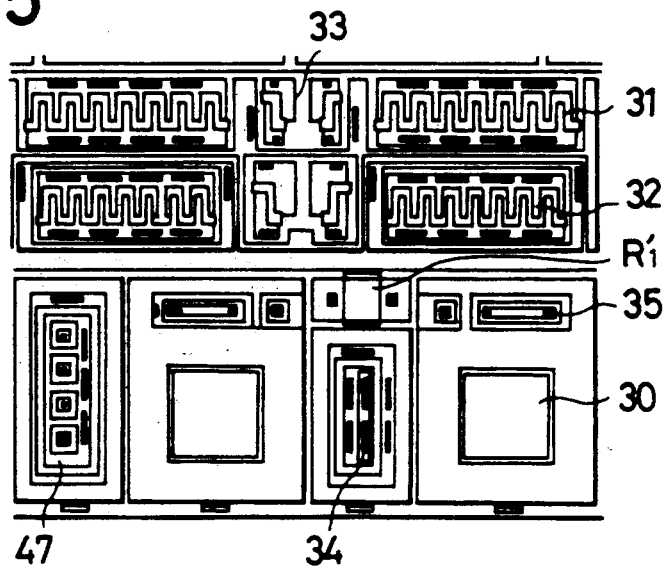
FIG. 15 is a plan view showing part of input and output buffer circuit section of the chip of FIG. 11.

Since a metal mask is required for each of the first and second metal interconnection layers and a contact mask is required for each of the first and second interconnection layers, four custom masks in total are required. The input/output buffer circuit section 3 of FIG. 11 includes, as shown in FIG. 15, driver P-channel MOS transistor 31, N-channel MOS transistor 32, NPN transistor 34, MOS transistor 33 for forming direct interconnection to TTL and input pull-up circuit and protective element 35, similarly with the input/output buffer circuit section 3 of the previously described embodiment, and, in addition, the structure of FIG. 15 includes a driver PNP transistor 47 which may be used to form an analog switch, so that there is more variety in forming input/output buffer circuits in this structure as compared with that of the previous embodiment.

As described in detail above, since bipolar analog circuits and CMOS logic circuits are formed on the same single chip, the present semiconductor device may be applied widely in various fields. The following is an illustrative list of fields or devices in which the present Bi-CMOS gate array may be advantageously applied.

(a) A/D and D/A converters
(b) Drivers of fluorescent display tubes and LED arrays
(c) Floppy disc drives
(d) Servo-motor controllers
(e) Various plotter controllers and drivers
(f) A.E. and A.F. systems of cameras
(g) Control circuits of VTR, VD and DAD systems
(h) Tone generators for music instruments
(i) Communication control circuits
(j) CPU peripheral circuits In the field of signal processing, input and output information is often in the form of analog quantity. With the present Bi-CMOS gate array formed as a merged system of analog circuits and logic circuits which are mainly controlled by a CPU, various advantages such as excellent analog performance which has not been able to obtain by the prior art IC, such as $I^2L$, and low power consumption can be obtained. In addition, the present invention allows to obtain advantages of miniaturization in the field of semi-custom ICs, thereby allowing to facilitate designing of various devices and appliances.

The characteristics of NPN transistors, lateral PNP transistors, resistors and logic circuit section employed in the present invention will be tabulated as follows:

TABLE 3

NPN transistors for small signal applications

| parameter | | min. | standard | max. | unit |
|---|---|---|---|---|---|
| | $I_C = 1$ mA | 100 | 200 | 300 | |
| $h_{FE}$ | $I_C = 1$ μA | 80 | 130 | 250 | |
| | matching accuracy | | | 5 | % |
| $V_{BE}$ | $I_C = 1$ μA | 550 | 570 | 590 | mV |
| $V_{BE}$ | matching offset | | | 1 | mV |
| $BV_{CEO}$ | | 40 | | | V |
| $BV_{CBO}$ | | 100 | | | V |
| $BV_{EBO}$ | | 82 | 8.4 | 8.6 | V |
| Saturation resistance | | | | 450 | ohm |
| $I_C = 1$ mA, $I_B = 100$ μA | | | | | |

TABLE 4

Lateral PNP transistors for small signal applications

| parameter | | min. | standard | max. | unit |
|---|---|---|---|---|---|
| | $I_C = 100$ μA | 50 | 75 | 110 | |
| $h_{FE}$ | $I_C = 1$ μA | 80 | 120 | 200 | |
| | matching accuracy | | | 5 | % |
| $V_{BE}$ | $I_C = 1$ μA | 510 | 540 | 570 | mV |
| $V_{BE}$ | matching offset | | | 1 | mV |
| $BV_{CEO}$ | | 20 | | | V |
| $BV_{CBO}$ | | 100 | | | V |
| $BV_{EBO}$ | | 100 | | | V |
| Saturation resistance | | 1,000 | 1,500 | 2,000 | ohm |
| $I_C = 100$ μA, $I_B = 10$ μA | | | | | |

TABLE 5

Resistor characteristics

| parameter | min | standard | max. | unit |
|---|---|---|---|---|
| base diffused resistance | | | | |
| absolute accuracy | −15 | 0 | 15 | % |
| specific accuracy | | | 2 | % |
| temp. coefficient | | | | |
| −25° C. to 0° C. | | 1,310 | | ppm/°C. |
| 0° C. to 25° C. | | 1,800 | | ppm/°C. |
| 25° C. to 75° C. | | 2,200 | | ppm/°C. |
| 75° C. to 100° C. | | 2,780 | | ppm/°C. |
| P well diffused resistance | | | | |
| absolute accuracy | −15 | 0 | 15 | % |
| specific accuracy | | | 3 | % |
| temp. coefficient | | 5,890 | | ppm/°C. |
| base pinch resistor | | | | |
| absolute accuracy | −50 | 0 | 100 | % |
| specific accuracy | | | 20 | % |
| temp. coefficient | | 6,240 | | ppm/°C. |
| max. appl. voltage | 82 | | | V |

TABLE 6

Logic circuit characteristics

| parameter | min. | standard | max. | unit |
|---|---|---|---|---|
| CMOS gate array region range of op. voltage | 1.8 | 5.0 | 6.0 | V |
| Basic cell | | | | |
| delay time (Fo = 1) | | 7 | | ns |
| $V_{CC} = 5V \pm 5\%$ (Fo = 3) | | 20 | | |
| Input/output circuit cell | | | | |
| $V_{IH}$ | 2.0 | | | V |
| $V_{IL}$ | | | 0.8 | V |
| $I_{oH}$ (Vo = 2.4 V and CMOS output) | −0.1 | | | mA |
| $I_{oL}$ (Vo = 0.4 V and CMOS output) | | | 1.6 | mA |
| $I_{oH}$ (NPN Tr in use) | −10 | | | mA |
| $I_{oL}$ (NPN Tr in use) | | | 10 | mA |
| PMOS source-drain break down voltage | 8 | | | V |

TABLE 6-continued

Logic circuit characteristics

| parameter | min. | standard | max. | unit |
|---|---|---|---|---|
| NMOS source-drain break down voltage | 15 | | | V |

While the above provides a full and complete disclosure of the preferred embodiments of the present invention, various modifications, alternate constructions and equivalents may be employed without departing from the true spirit and scope of the invention. Therefore, the above description and illustrations should not be construed as limiting the scope of the invention, which is defined by the appended claims.

What is claimed is:

1. A process for manufacturing a Bi-CMOS semiconductor semi-custom gate array chip, comprising the steps of:

forming on a substrate a layer of semiconductor material having a first conductivity type;

forming a logic section at a central area of the semi-custom gate array chip comprising an array of regularly arranged basic cells, each basic cell including transistor elements formed to have gates corresponding to a two-input NAND circuit or a two-input NOR circuit and said logic section including both bipolar and CMOS transistors;

forming a plurality of pads and a transistor set corresponding to each of said plurality of pads, said plurality of pads and corresponding transistors sets arranged in an outer-most peripheral section of said semi-custom gate array chip which surrounds said logic section;

and interconnecting said basic cells, pads, and transistor sets by two level custom mask defined interconnects to thereby define a desired circuit wherein at least two of said pads and transistor sets are interconnected by said custom mask defined interconnects to thereby form input/output sections, at least two of which may be configured into circuits different from each other.

2. The process of claim 1, wherein said pads, transistors and transistor sets constitute an input/output buffer section, and the set of transistors corresponding to a pad contain at least one transistor different than the set of transistors corresponding to an adjacent pad.

3. The process of claim 2, wherein at least two of said transistors sets of said buffer section are configured differently so as to define at least two different circuits from the group consisting of a TTL direct input circuit, a CMOS input/output circuit, a tristate buffer circuit, or an NPN/PNP input/output circuit.

4. The process of claim 1, wherein each of said transistor sets are comprised of P-channel MOS and N-channel MOS transistors.

5. A process for manufacturing a Bi-CMOS semiconductor semi-custom gate array chip, comprising:

forming a substrate having a covering layer of semiconductor material of a first conductivity type;

forming a logic section at a central area of the chip comprising an array of regularly arranged basic cells, each basic cell including transistor elements formed gates corresponding to a two-input NAND circuit or a two-input NOR circuit, and said logic circuit including both bipolar and CMOS transistors; and forming a peripheral section surrounding the logic circuit and including a number of pads which are at the periphery of the chip and a respective set of transistors associated with each pad, which sets of transistors and basic cells are connected by two level custom mask defined interconnects into a number of input/output buffer circuits;

wherein each set of transistors of said peripheral section includes at least one bipolar transistor and at least one MOS transistor and wherein the set of transistors for at least one pad may be connected differently than the set of transistors for an adjacent pad.

6. The process of claim 5, wherein at least a selected one of said input/output buffer circuits includes at least one protective element interconnected by custom mask defined interconnects with at least one bipolar transistor which is a part of the same selected set of transistors as said at least one protective element.

7. The process of claim 5, including a bipolar analog section which occupies an area of said chip which is surrounded by said peripheral section.

8. The process of claim 5, wherein at least two of said buffer circuits are each configured differently to define at least two different circuits from the group consisting of a TTL direct input circuit, a CMOS input/output circuit, a tristate buffer circuit, or an NPN/PNP input/output circuit.

9. The process of claim 5, wherein said step of forming a peripheral section further comprises forming both NPN and PNP bipolar transistors in each of said number of input/output buffer circuits.

10. The process of claim 9, wherein the channel size of said at least one MOS transistor of each set of transistors in said number of input/output buffer circuits is formed to be larger than the channel size of said CMOS transistors in said logic circuit section.

11. The process of claim 9, wherein said at least one MOS transistor of said number of input/output buffer circuits is formed to be compatible with TTL logic.

12. The process of claim 9 in which said at least one bipolar transistor and said at least one MOS transistor of each set of transistors are formed to be selectively connectable by said custom interconnects in any desired circuit configuration.

13. The process of claim 5, wherein said step of forming a logic circuit section further comprises forming both lateral and vertical bipolar transistors in said logic circuit section.

14. The process of claim 13 wherein the channel size of said at least one MOS transistor of each set of transistors in said number of input/output buffer circuits is formed to be larger than the channel size of said CMOS transistors in said logic circuit section.

15. The process of claim 13 in which said at least one of said MOS transistors of said number of input/output buffer circuits is formed to be compatible with TTL logic.

16. The process of claim 13 in which said at least one bipolar transistor of each set of transistors is formed between two of said number of pads.

* * * * *